United States Patent [19]

Itoh et al.

[11] Patent Number: 5,028,883

[45] Date of Patent: Jul. 2, 1991

[54] TONE CONTROLLER FOR ATTENUATING NOISE IN THE SIGNAL GENERATED BY RECEIVER FROM WEAK ELECTRIC FIELD, AND RECEIVER HAVING THE TONE CONTROLLER

[75] Inventors: Masashi Itoh; Yutaka Matsumoto; Yukio Ozaki, all of Yokohama, Japan

[73] Assignee: Kabushiki Kaisha Toshiba, Kawasaki, Japan

[21] Appl. No.: 409,292

[22] Filed: Sep. 19, 1989

[30] Foreign Application Priority Data

Sep. 22, 1988 [JP] Japan .................................. 63-236301

[51] Int. Cl.$^5$ ............................................. H03F 3/45
[52] U.S. Cl. .................................... 330/254; 381/101
[58] Field of Search ............... 330/252, 254, 302, 304, 330/306, 261, 303; 381/101, 102

[56] References Cited

U.S. PATENT DOCUMENTS 3,908,172 9/1975 Aschermann et al. .............. 330/254

FOREIGN PATENT DOCUMENTS 57-91039 6/1982 Japan .

OTHER PUBLICATIONS

IC Data Book, TA8130Z, Toshiba, pp. 234–243.

Primary Examiner—Steven Mottola
Attorney, Agent, or Firm—Finnegan, Henderson, Farabow, Garrett and Dunner

[57] ABSTRACT

A tone control circuit having a first differential amplifier and a second differential amplifier. The first differential amplifier comprises first and second transistors whose emitters are connected. The second differential amplifier comprises third and fourth transistors whose emitters are connected. The base and collector of the third transistor are connected to the base of the second transistor and the collector of the first transistor, respectively. The base and collector of the fourth transistor are connected to the base of the first transistor and the collector of the second transistor, respectively. A demodulated signal is input to the differential amplifier, and also to the second different amplifier via a bandpass filter. When a tone control signal is supplied to the bases of the first to fourth transistors, a signal generated by attenuating at least the low-frequency component of the demodulated signal is output from a tone control-signal output terminal connected to the collectors of the first to fourth transistors.

7 Claims, 5 Drawing Sheets

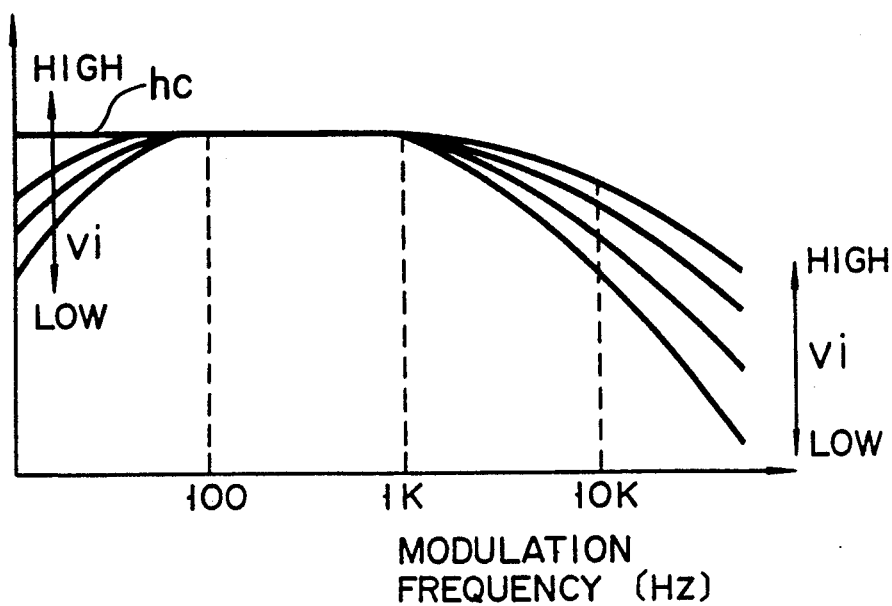
F I G. 2
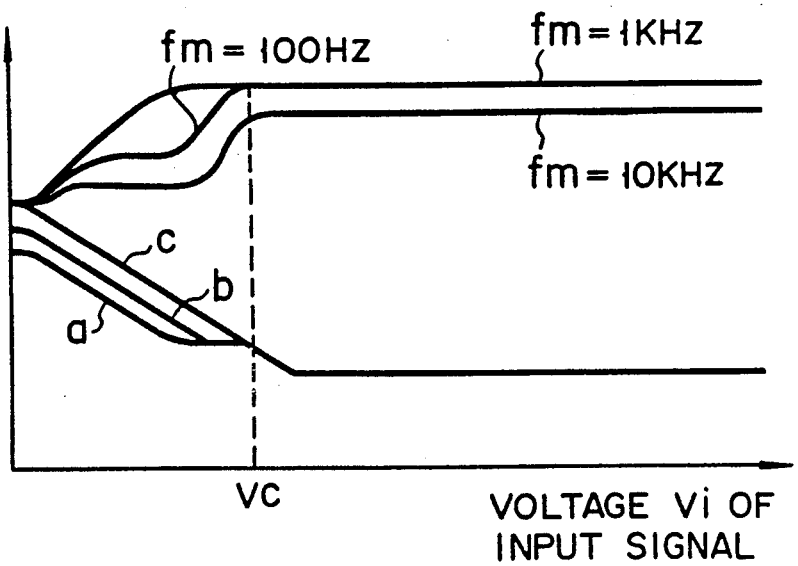
F I G. 3

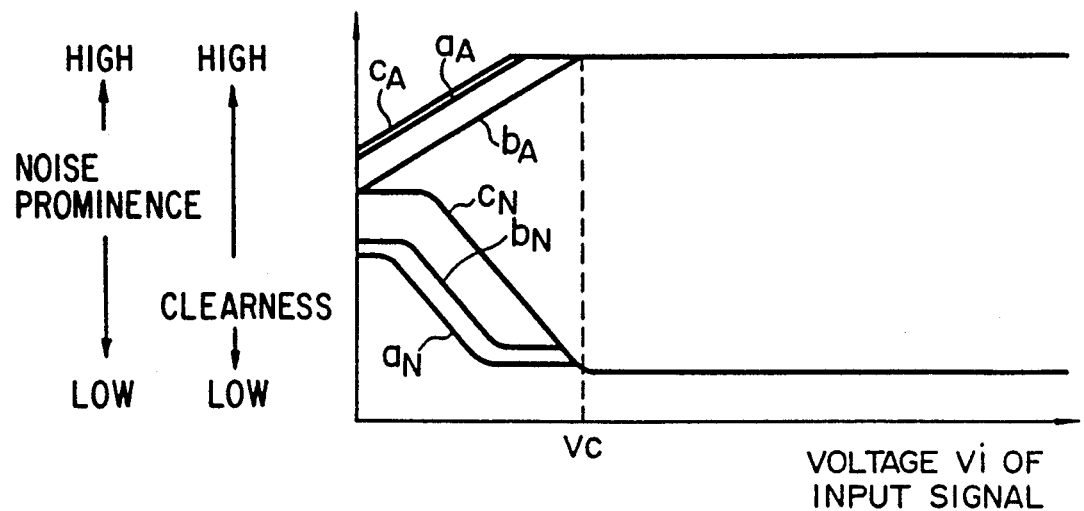
F I G. 4
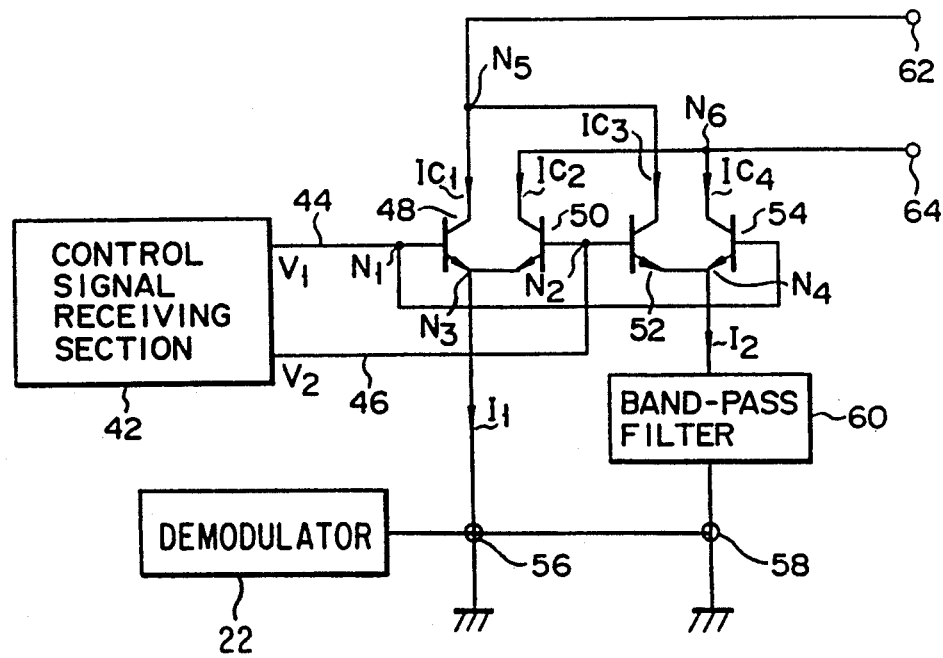
F I G. 5

TONE CONTROLLER FOR ATTENUATING NOISE IN THE SIGNAL GENERATED BY RECEIVER FROM WEAK ELECTRIC FIELD, AND RECEIVER HAVING THE TONE CONTROLLER

BACKGROUND OF THE INVENTION

1. Field of the Invention

The present invention relates to a tone controller and a receiver having the tone controller circuit, and more particularly, to a tone controller circuit for attenuating the noise contained in the signal which a receiver generates from a weak electric field, and also a receiver having this tone controller.

2. Description of the Related Art

Generally, the amplitude of the signal a receiver has generated by demodulating FM or AM waves is proportional to the intensity of the electric field of the FM or AM waves. Hence, the lower the intensity of the electric field, the smaller the amplitude the signal has. Further, the smaller amplitude of the signal, the smaller gain and the lower signal-to-noise (S/N) ratio the signal will have. In particular, a signal the receiver has generated from FM waves containing noise components of relatively high frequencies, i.e., so-called triangular noise-waves, has a very low S/N ratio. In order to improve the S/N ratio of the signal, a high-cut controller is used in a receiver. This controller attenuates the high-frequency noise components contained in the signal generated by demodulating the waves of a weak electric field, to the degree inversely proportional to the amplitude of the signal.

More specifically, in such a prior-art receiver, an intermediate-frequency (IF) amplifier performs limited amplification on a signal supplied from the antenna via a front-end, a demodulator demodulates the signal output by the IF amplifier into an audio signal, and a high-cut controller (for example, TA8130Z manufactured by Toshiba) attenuates the high-frequency component of the audio signal. Part of the signal output by the IF amplifier is input to an amplitude detector. The detector outputs a control signal at a level proportional to the amplitude of the input signal. The control signal is adjusted by a semi-fixed resistor, so as to be input to the high-cut controller through a sensitivity adjuster. If the output signal of the demodulator has been generated from weak waves, its high-frequency component is greatly attenuated by means of the high-cut controller. By contrast, if the output signal of the demodulator has been generated from strong waves, its high-frequency component is not attenuated by the high-cut controller.

To attenuate the noise component of the output signal of the demodulator, which has been generated from a low-intensity electric field, the high-frequency component of the signal is attenuated in reverse proportion to the voltage of this signal, thereby to increase the S/N ratio of the signal.

As far as the voltage of the signal output by the demodulator is as low as the voltage required for driving the high-cut controller, the high-cut controller can sufficiently attenuate the high-frequency component (demodulation frequency fm=10KHz), thus sufficiently reducing the noise component. The noise reproduced from the audio signal output by the receiver is indeed far less prominent to the listener than the noise reproduced from the audio signal generated by a receiver without a high-cut controller, but the sound reproduced from the same audio signal is less clear than in the case where the receiver has no high-cut controllers to attenuate the high-frequency component of the signal output by the demodulator. This is because the main components of the audio signal are of low frequency and intermediate frequency.

SUMMARY OF THE INVENTION

It is accordingly the object of the present invention to provide a tone controller which can automatically adjust the attenuation of the low-frequency and high-frequency components of a signal output by a demodulator.

The other object of the invention is to provide a receiver wherein the noise component of a signal generated by a demodulator from a weak electric field is attenuated, thereby to produce an audio signal having an S/N ratio high enough to reproduce sufficiently clear sound.

According to an aspect of the present invention, there is provided a tone controller which comprises first differential amplifier means comprising a first transistor and a second transistor, each having a base, a collector, and an emitter, the emitters of said first and second transistors being connected, forming a first node, second differential amplifier means comprising a third transistor and a fourth transistor, each having a base, a collector, and an emitter, the emitters of said third and fourth transistors being connected, forming a second node, the base and collector of said third transistor being connected to the base of said second transistor and the collector of said first transistor, respectively, and the base and collector of said fourth transistor being connected to the base of said first transistor and the collector of said second transistor, respectively, attenuation means connected to said second node, for attenuating at least a low-frequency component of a demodulated signal which is to be supplied to said second differential amplifier, output means connected to said attenuation means, for supplying said demodulated signal to said first and second differential amplifier means, control-signal receiving means for supplying a control signal to the bases of said first and fourth transistors and also to the bases of said second and third transistors, and output section having a first output terminal connected to the collectors of said first and third transistors, and a second output terminal connected to the collectors of said second and fourth transistors, wherein said first and second differential amplifier means supplies to said output section an output signal, at least the low-frequency component of which has been attenuated by said attenuation means in accordance with a voltage controlled by said control-signal receiving means.

According to another aspect of the invention, there is provided a receiver capable of performing tone control, which comprises frequency converting means for converting electric waves into an electrical signal having a predetermined frequency, intermediate-frequency amplifier means having a first output terminal and a second output terminal, for amplifying a gain of the signal output from said frequency converting means, demodulation means for demodulating a signal amplified by said intermediate-frequency amplifier means and output from the first output terminal of said intermediate-frequency amplifier means, signal-amplitude detecting means for generating a control signal in accordance with the amplitude of the signal amplified by said intermediate-frequency amplifier means and output from the second output terminal of said intermediate-frequency amplifier means, sensitivity adjusting means for adjusting the sensitivity of the control signal output from said signal-amplitude detecting means to a predetermined value, tone control means for controlling the attenuation of at least a low-frequency component of the signal demodulated by said demodulation means, in accordance with the signal output from said sensitivity adjusting means, and output means for outputting the signal the attenuation of which has been controlled by said tone control means.

BRIEF DESCRIPTION OF THE DRAWINGS

The aforementioned aspects and other features of the present invention are explained in the following description, taken in connection with the accompanying drawings, wherein:

FIG. 2 is a graph representing the relationship between the modulation frequency and output voltage of the receiver;

FIG. 3 is a graph showing the relationship between the input voltage and the output noise-signal voltage of the receiver;

FIG. 4 is a graph illustrating the relationship between the input voltage of the receiver, on the one hand, and the clearness and noise prominence of the sound reproduced by the speaker incorporated in the receiver;

FIG. 5 is an equivalent circuit diagram explaining the basic structure of the tone controller which is incorporated in the receiver shown in FIG. 1 and which is also an embodiment of the present invention;

DETAILED DESCRIPTION OF THE PREFERRED EMBODIMENTS

Embodiments of the present invention will now be described in detail, with reference to the accompanying drawings.

Figure 1:
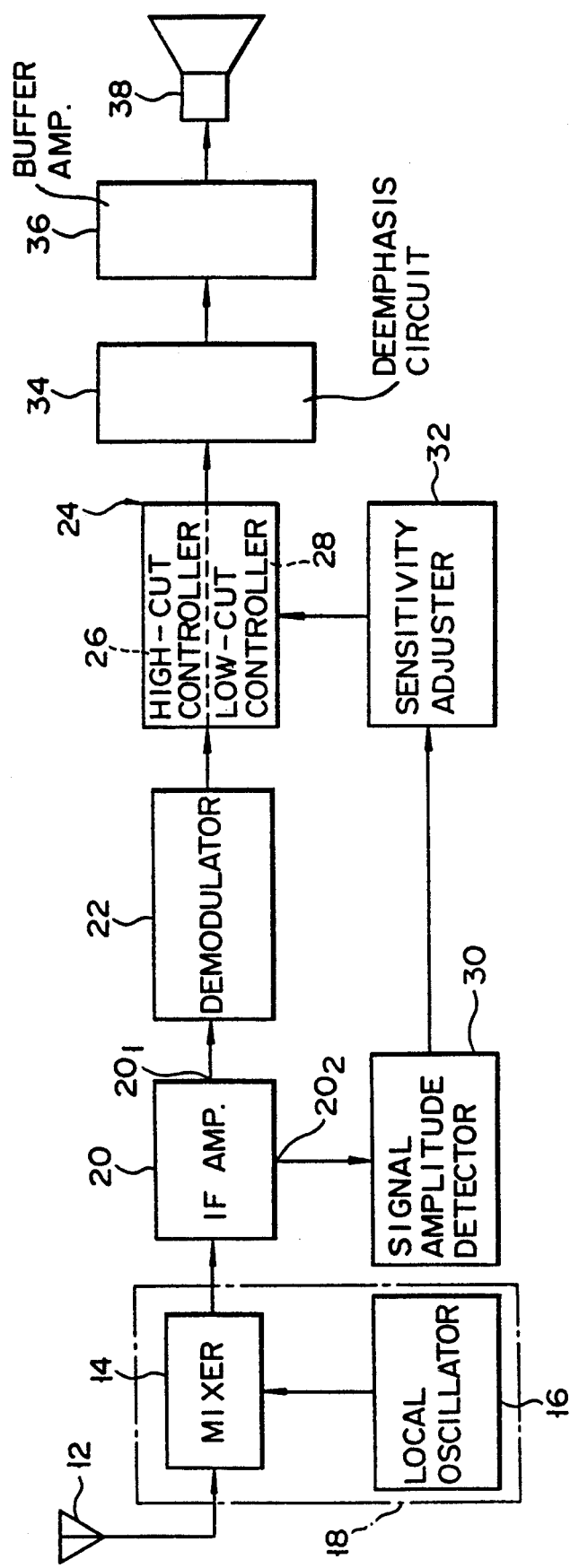
FIG. 1 is a block diagram illustrating a receiver according to the present invention.

FIG. 1 is a block diagram illustrating a receiver according to the invention. As is shown in this figure, the receiver comprises an antenna 12, a front-end 18, an IF amplifier 20, a demodulator 22, a tone controller 24, a signal-amplitude detector 30, a sensitivity adjuster 32, a deemphasis circuit 34, a buffer amplifier 36, and a speaker 38. The front-end 18 comprises a mixer 14 and a local oscillator 16. The tone controller 24 comprises a high-cut controller 26 and a low-cut controller 28. The sensitivity adjuster 32 includes a semi-fixed resistor.

In operation, the antenna 12 receives the signal waves transmitted from a transmitter (not shown). The waves are input to the front-end 18. The front-end 18 generates signals having a predetermined frequency (10.7MHz), from the signal waves. The signals are supplied to the IF amplifier 20 and amplified thereby. The amplified signals are supplied via a first output terminal $20_1$ to the demodulator 22. The demodulator 22 demodulates the signals. The demodulated signals are input to the tone controller 24.

Meanwhile, part of each signal amplified by the IF amplifier 20 is input via a second output terminal $20_2$ to the signal-amplitude detector 30. The detector 30 outputs a signal at a level proportional to the amplitude of the signal. The control signal is input to the sensitivity adjuster 32, which adjusts the sensitivity of the control signal. The control signal, now having an appropriate sensitivity, is supplied to the control terminal (not shown) of the tone controller 24. In the tone controller 24, in accordance with the control signal, the controllers 26 and 28 attenuate the high-frequency components of the demodulated signals and the low-frequency components therefore, respectively. Each signal output by the tone controller 24 is supplied through the deemphasis circuit 3 to the buffer amplifier 36 and is amplified thereby. The amplified signal is supplied to the speaker 38. The speaker 38 converts the signal into sound.

The tone controller 24 attenuates the high-frequency and low-frequency components of each demodulated signal, to the extent determined by the level of the control signal output from the signal-amplitude detector 30. More specifically, the degree of the attenuation is inversely proportional to the voltage Vi of the signal input to the detector 30, as is illustrated in FIG. 2. Hence, the lower the voltage Vi, the greater the low-frequency component of the signal, as well as the high-frequency component thereof is attenuated. Without the low-cut controller 28, the tone controller 24 would output a signal whose voltage does not change, like the voltages of 100Hz to 1KHz signals, as can be understood from curve hc shown in FIG. 2.

The voltage of the output noise signal has such relationship as is shown in FIG. 3, with the voltage of the input signal. As is evident from FIG. 3, when the voltage Vi of the input signal falls below a low voltage Vc which is the highest voltage for driving the tone controller 24, the voltage of the output noise signal changes. More precisely, as the voltage Vi falls, the output voltage corresponding to the low-frequency component (fm=100Hz) and the output voltage corresponding to the high-frequency component (fm=1KHz) also fall.

In FIG. 3, the curves a, b, and c indicate how the voltage of the noise signal varies with the voltage Vi, when the controller 24 has both the high-cut controller and the low-cut controller, when the controller 24 has only the high-cut controller, and when no tone controllers are used. When the voltage Vi falls below the low voltage Vc, the voltage of the noise signal a falls far more than that of the noise signal c. Further, the voltage of the noise signal a falls more than that of the noise signal b output from a tone controller having only a high-cut controller, since the low-frequency component contains some noise, too.

FIG. 4 is a graph illustrating the relationship between the voltage Vi of the input signal, on the one hand, and the clearness and noise prominence of the sound reproduced by the speaker incorporated in the receiver. In this figure, the curves $a_A$, $b_A$, and $c_A$ indicate how the clearness of the sound varies with the voltage Vi, when the controller 24 has both the high-cut controller and the low-cut controller, when the controller 24 has only the high-cut controller, and when no tone controllers are used. Also in FIG. 4, curves $a_N$, $b_N$, and $c_N$ indicate how the noise prominence changes with the voltage Vi, when the controller 24 has both the high-cut controller and the low-cut controller, when the controller 24 has only the high-cut controller, and when no tone controllers are used. As is evident from curves $a_A$, $b_A$, and $c_A$, the clearness of the sound is far greater than in the case where the controller 24 has only a high-cut controller, and is almost the same as the clearness achieved in the case where no tone controllers are used. In addition, as is clearly understood from the curves $a_N$, $b_N$, and $c_N$, the noise prominence is as small as in the case where the tone controller 24 has only a high-cut controller, and is also as small as in the case where no tone controllers are used. Hence, in the receiver shown in FIG. 1, the signal generated by the tone controller 24 has an S/N ratio higher than is obtained in the conventional receiver wherein only a high-cut controller is used, or no tone controllers are used.

FIG. 5 is an equivalent circuit diagram representing the basic structure of the tone controller 24. As this figure shows, the tone controller 24, which is another embodiment of this invention, comprises a control-signal receiving section 42, four transistors 48, 50, 52, and 54, input terminals 56 and 58, and a band-pass filter 60. The section 42 has two output terminals 44 and 46 for supplying control signals. The input terminals 56 and 58 are connected to receive two signals output by the demodulator 22 (FIG. 1), respectively. The first output terminal 44 is connected a node $N_1$, which is connected to the base of the first transistor 48 and the base of the fourth transistor 54. The second output terminal 46 is coupled to a node $N_2$, which is connected to the base of the second transistor 50 and the base of the third transistor 52. The emitters of the transistors 48 and 50 are coupled to each other, forming a node $N_3$, whereby the transistors 48 and 50 constitute a first emitter-coupled, differential amplifier. Similarly, the emitters of the transistors 52 and 54 are coupled to each other, forming a node $N_4$, whereby the transistors 52 and 54 constitute a second emitter-coupled, differential amplifier. The band-pass filter 60 is connected to the node $N_4$.

The input terminal 56 is connected to node $N_3$, for supplying one of the two signals output by the demodulator 22 to the node $N_3$. The input terminal 58 is connected to the band-pass filter 60, for supplying the other signal output by the demodulator 22 to the node $N_4$ through the band-pass filter 60 which function as a tone control section. The collectors of the transistors 48 and 52 are connected to each other, forming a node $N_5$ which is connected to a power-source terminal 62. The collectors of the transistors 50 and 54 are connected to each other, forming a node $N_6$ which is connected to a control signal output terminal 64.

The operation of the tone controller 24, described above, will now be explained. First, a signal current $I_1$ output by the demodulator 22 is supplied to the first input terminals 56 and 58. When current $I_1$ is supplied from the input terminal 56 to the first emitter-coupled, differential amplifier, a voltage $V_1$ is output from the first terminal 44 of the control-signal receiving section 42. When the signal current $I_1$ is supplied from the input terminal 58 to the band-pass filter 60, the filter 60 removes the low-frequency and high-frequency of the signal current $I_1$, and outputs a current $I_2$. When the current $I_2$ is supplied to the second emitter-coupled, differential amplifier, a reference voltage $V_2$ of a predetermined value is output from the second output terminal 46 of the section 42. The voltage $V_1$ is applied to the bases of the transistors 48 and 54, and the reference voltage $V_2$ is applied to the bases of the transistors 50 and 52.

Figure 6A:
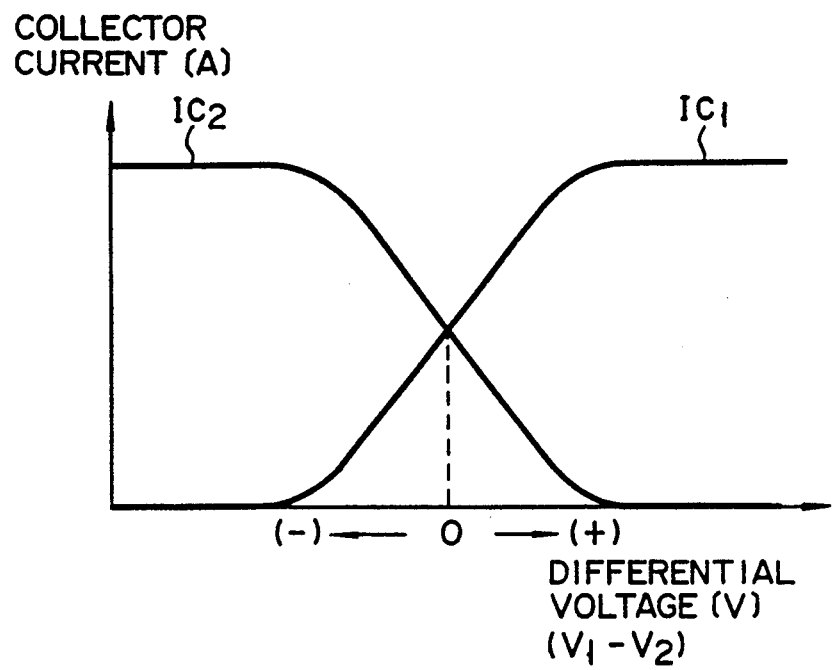
FIGS. 6A and 6B are graphs representing the relationship between the differential voltage and collector current of the differential amplifying section of the tone controller shown in FIG. 5.
Figure 6B:
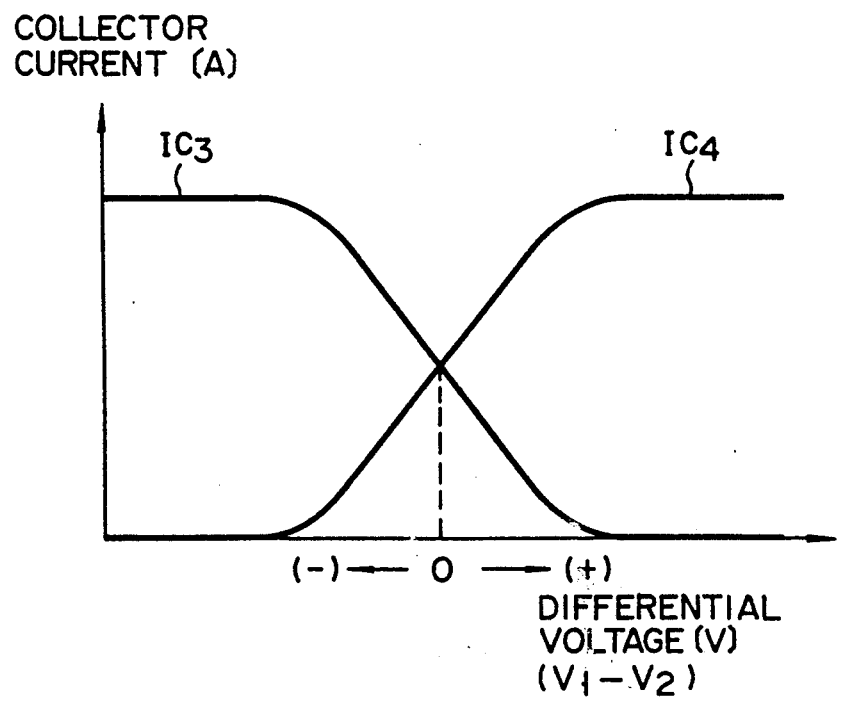

The collector currents $I_{c1}$ and $I_{c2}$ of the transistors 48 and 50 have such shares as are shown in FIG. 6A. The collector currents $I_{c3}$ and $I_{c4}$ of the transistors 52 and 54 have such shares as are shown in FIG. 6B. When the voltage $V_1$ is much higher than the reference voltage $V_2$, that is, when $(V_1-V_2)$ is very great, the transistors 48 and 54 are turned on, whereas the transistors 50 and 52 are turned off. Then, only the collector current $I_{c4}$ flows through the transistor 54 and is output from the control signal output terminal 64. The collector current $I_{c4}$ is identical to the current output by the band-pass filter 60 which has removed the low-frequency component and the high-frequency component from the current $I_2$ output by the demodulator 22.

When the voltage $V_1$ is slightly lower than the reference voltage $V_2$, the transistors 48 and 54 are turned off, whereas the transistors 50 and 52 are turned on. In this case, the collector current $I_{c2}$ flows through the transistor 50 and is output from the control signal output terminal 64. The collector current $I_{c2}$ is identical to the current $I_1$ which contains a low-frequency component and a high-frequency component.

When the voltage $V_1$ is slightly higher than the reference voltage $V_2$, the transistors 48, 50, 52, and 54 are turned on. In this case, the collector current $I_{c2}$ of the transistor 50 and the corrector current $I_{c4}$ combine into a great current which contains less low-frequency component and less high-frequency component than the current $I_1$. As can be understood from FIGS. 6A and 6B, the collector currents $I_{c2}$ and $I_{c4}$ change in inverse proportion to each other. Therefore, the attenuation of the low-frequency and high-frequency components of the signal current $I_1$ can be adjusted to a desired value by changing the voltage $V_1$ to be applied from the first terminal 44.

Figure 7:
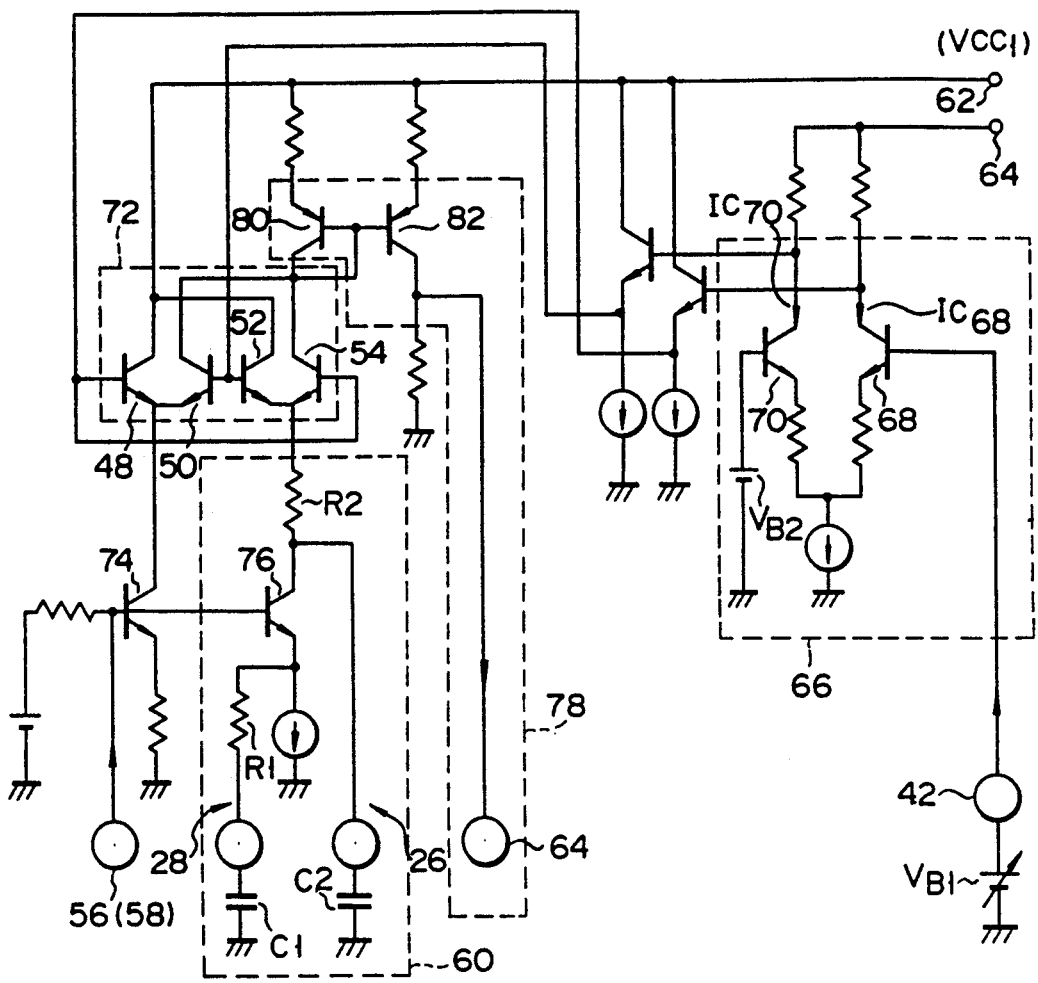
FIG. 7 is an equivalent circuit diagram showing the controller in greater detail.

With reference to FIG. 7, the tone controller 24 will now be explained in greater detail. The voltage of the control signal output from the signal-amplitude detector 30 is adjusted to a voltage $V_{B1}$ by the sensitivity adjuster 32. The voltage $V_{B1}$ is applied to the control-signal receiving section 42 and then to the base of a transistor 68 which constitutes a differential amplifier 66, jointly with a transistor 70. A reference voltage $V_{B2}$ having a predetermined value is applied to the base of the transistor 70. The signal output from the transistor 68 is supplied to the bases of transistors 48 and 54 which constitute a signal synthesizer 72, jointly with transistors 50 and 52. The signal output from the transistor 70 is supplied to the bases of the transistors 50 and 52. The signal output by the demodulator 22 are supplied to input terminals 56 and 58. This signal is supplied from the terminal 56 to the base of a transistor 74. It is also supplied to the base of a transistor 76 incorporated in a tone control section 60 (i.e., a band-pass filter). The differential amplifier 66 changes the base currents of the transistors 48, 50, 52, and 54 of the signal synthesizer 72 in accordance with the control signal input to the control-signal receiving section 42.

Figure 8:
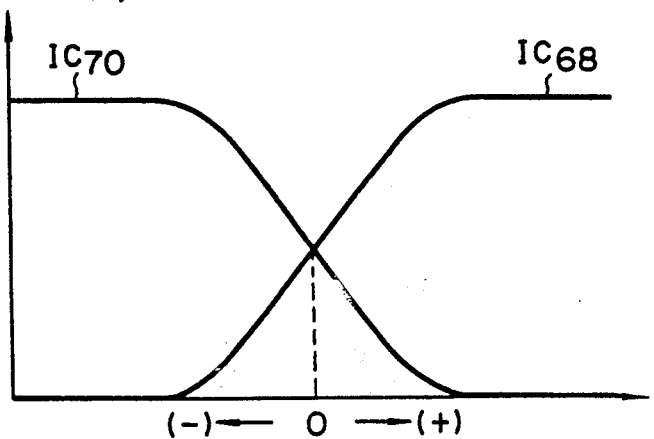
FIG. 8 is a graph illustrating the relationship between the differential voltage and collector current of the differential amplifying section of the tone controller shown in FIG. 7.

The collector currents $I_{c68}$ and $I_{c70}$ of the transistors 68 and 70, both incorporated in the differential amplifier 66, change with the differential voltage of the amplifier 66, i.e., $V_{B1}-V_{B2}$, as is illustrated in FIG. 8. As is evident from FIG. 8, when the voltage $V_{B1}$ of the control signal is much higher than the reference voltage $V_{B2}$, the current $I_{c70}$ is 0A, and only the current $I_{c68}$ flows to a control-signal output terminal 64. On the other hand, when the voltage $V_{B1}$ is much lower than the reference voltage $V_{B2}$, only the current $I_{C70}$ flows to the terminal 64, and the current $I_{C68}$ is 0A. When the voltages $V_{B1}$ and $V_{B2}$ are equal, both transistors 68 and 70 are turned on, and their collector current $I_{C68}$ and $I_{C70}$ changes in inverse proportion to each other, in accordance with the voltage $V_{B1}$ of the control signal.

When the voltage $V_{B1}$ of the control signal is far lower than the reference voltage $V_{B2}$, the base voltage of the transistor 70 will be much higher than that of the transistor 68. In this case, the transistor 68 is turned off, and only the collector current $I_{C70}$ of the transistor 70 flows to the terminal 64. As a result, in the signal synthesizer 72, a current flows to the bases of the transistors 48 and 54, and no currents flow to the bases of the transistors 50 and 52.

The emitter current of the transistor 48 flows to the power source $V_{CC1}$ through a power-supply terminal 62. Therefore, the emitter current of only the transistor 54, which has passed through the tone control section 60, flows to the collector of a transistor 80 which constitute an output section 78 (i.e., a current mirror), jointly with a transistor 82, and also to the bases of both transistors 80 and 82. This current is supplied from the terminal 64, as the output signal of the tone controller 24.

In the tone control section 60, a series circuit of a resistor R1 and a capacitor C1, which functions as the low-cut controller 28, is connected to the collector of the transistor 76, and a series circuit of a resistor R2 and a capacitor C2, which functions as the high-cut controller 26, is coupled to the collector of the transistor 76. The resistance of the resistors R1 and the capacitance of the capacitor C1 determine the cut-off frequency $f_{CL}$ for the low-frequency component of the signal output from the demodulator 22; the resistance of the resistor R2 and the capacitance of the capacitor C2 determine the cut-off $f_{CH}$ for the high-frequency component of said signal. That is:

$$f_{CL} = \frac{1}{2\pi R1C1}$$

$$f_{CH} = \frac{1}{2\pi R2C2}$$

As is evident from these equations, any desired frequency component can be filtered out of the signal output by the demodulator 22, by using resistors having appropriate resistances and capacitors having suitable capacitances.

When the voltage $V_{B1}$ of the control signal is much higher than the reference voltage $V_{B2}$, the transistors 48 and 54 incorporated in the signal synthesizer 72 are turned off, whereas the transistors 50 and 52 are turned on. In this case, the emitter current of the transistor 52 flows to the power source $V_{CC1}$ through the power-source terminal 62. As a result, the signal output by the demodulator 22, whose low-frequency component or high-frequency component has not been attenuated, is output through the transistor 50.

When there is a small difference between the voltages $V_{B1}$ and $V_{B2}$, the transistors 48, 50, 52, and 54,—all incorporated in the signal synthesizer 72—are turned on. Hence, currents flow through the collectors of these transistors. As a result of this, the signal output from the demodulator 22 is supplied through transistors 74 and 50 and also through the tone control section 60 and the transistor 54. The signal synthesizer 72 combines the currents passing through the two paths, thus generating a tone-controlled signal. As has been described, in the signal synthesizer 72, the transistors 48 and 50 constitute the first differential amplifier, and the transistors 52 and 54 constitute the second differential amplifier. Therefore, any desired frequency component of the signal output by the demodulator 22 can be attenuated by changing the voltage $V_{B1}$ of the control signal input to the control-signal receiving section 42.

As has been described, the tone controller 24 can attenuate both the low-frequency component and the high-frequency component of an input signal to any desired degree, in inverse proportion to the voltage of the DC control signal input to the control-signal receiving section, which is proportional to the amplitude of the input signal.

What is claimed is:

1. A tone control circuit comprising:
   first differential amplifier means comprising a first transistor and a second transistor, each having a base, a collector, and an emitter, the emitters of said first and second transistors being connected, forming a first node;
   second differential amplifier means comprising a third transistor and a fourth transistor, each having a base, a collector, and an emitter, the emitters of said third and fourth transistors being connected, forming a second node, the base and collector of said third transistor being connected to the base of said second transistor and the collector of said first transistor, respectively, and the base and collector of said fourth transistor being connected to the base of said first transistor and the collector of said second transistor, respectively;
   attenuation means connected to said second node, for attenuating at east a low-frequency component of a demodulated signal which is to be supplied to said second differential amplifier;
   output means connected to said attenuation means, for supplying said demodulated signal to said first and second differential amplifier means;
   control-signal receiving means for supplying a control signal to the bases of said first and fourth transistors and also to the bases of said second and third transistors; and
   output section having a first output terminal connected to the collectors of said first and third transistors, and a second output terminal connected to the collectors of said second and fourth transistors, wherein said first and second differential amplifier means supplies to said output section an output signal, at least the low-frequency component of which has been attenuated by said attenuation means in accordance with a voltage controlled by said control-signal receiving means.

2. A circuit according to claim 1, wherein said attenuation means comprises a band-pass filter.

3. A circuit according to claim 2, wherein said band-pass filter has a low-cut filter for removing a low-frequency component from the demodulated signal, and a high-cut filter for removing a high-frequency component from the demodulated signal.

4. A circuit according to claim 3, wherein said band-pass filter attenuates the high-frequency and low-frequency components of the modulated signal to desired degrees.

5. A circuit according to claim 1, wherein said control-signal receiving means applies a reference voltage and a control voltage to said first and second differential amplifier means, respectively, said control voltage having a predetermined value.

6. A circuit according to claim 5, wherein said control-signal receiving means applies said reference voltage to said bases of said second and third transistors, and the control voltage to the bases of said first and fourth transistors.

7. A circuit according to claim 1, wherein said control-signal receiving means applies a reference voltage and a control voltage to said first and second differential amplifier means, respectively, said control voltage capable of having various values.

* * * * *

UNITED STATES PATENT AND TRADEMARK OFFICE
CERTIFICATE OF CORRECTION

PATENT NO. : 5,028,883
DATED : July 02, 1991
INVENTOR(S) : Masashi Itoh et al.

It is certified that error appears in the above-identified patent and that said Letters Patent is hereby corrected as shown below:

Claim 1, column 8, line 36, change "east" to --least--.

Abstract, line 13, change "different" to --differential--.

Claim 6, column 10, line 1, before "control" change "the" to --said--.

Signed and Sealed this

Twenty-seventh Day of April, 1993

*Attest:*

MICHAEL K. KIRK

*Attesting Officer*      *Acting Commissioner of Patents and Trademarks*